United States Patent
Andreas (10) Patent No.: US 7,367,343 B2
(45) Date of Patent: May 6, 2008

(54) METHOD OF CLEANING A SURFACE OF A COBALT-CONTAINING MATERIAL, METHOD OF FORMING AN OPENING TO A COBALT-CONTAINING MATERIAL, SEMICONDUCTOR PROCESSING METHOD OF FORMING AN INTEGRATED CIRCUIT COMPRISING A COPPER-CONTAINING CONDUCTIVE LINE, AND A COBALT-CONTAINING FILM CLEANING SOLUTION

(75) Inventor: Michael T. Andreas, Manassas, VA (US)

(73) Assignee: Micron Technology, Inc., Boise, ID (US)

( * ) Notice: Subject to any disclaimer, the term of this patent is extended or adjusted under 35 U.S.C. 154(b) by 150 days.

(21) Appl. No.: 11/338,174

(22) Filed: Jan. 23, 2006

(65) Prior Publication Data

US 2007/0173062 A1  Jul. 26, 2007

(51) Int. Cl.
   *B08B 6/00*   (2006.01)
   *C25F 1/00*   (2006.01)
   *C25F 3/30*   (2006.01)
   *C25F 5/00*   (2006.01)

(52) U.S. Cl. .................. 134/1.3; 134/3; 438/745; 216/109

(58) Field of Classification Search .............. 134/1.3, 134/3, 2; 216/100, 108, 109; 438/745
   See application file for complete search history.

(56) References Cited

U.S. PATENT DOCUMENTS

| | | | |
|---|---|---|---|
| 3,831,265 A | 8/1974 | Louzon et al. | |
| 4,415,606 A | 11/1983 | Cynkar et al. | |
| 4,938,257 A | 7/1990 | Morris | |
| 5,017,267 A | 5/1991 | Cordani | |
| 5,213,622 A | 5/1993 | Bohling et al. | |
| 5,382,296 A | 1/1995 | Anttila | |
| 5,633,121 A | 5/1997 | Namiki et al. | |
| 5,681,398 A | 10/1997 | Muraoka | |
| 5,695,810 A * | 12/1997 | Dubin et al. | 438/643 |
| 5,861,076 A | 1/1999 | Adlam et al. | |
| 5,863,344 A | 1/1999 | Nam | |
| 5,939,334 A | 8/1999 | Nguyen et al. | |
| 6,083,840 A | 7/2000 | Mravic et al. | |
| 6,100,184 A * | 8/2000 | Zhao et al. | 438/638 |
| 6,124,214 A | 9/2000 | Hembree et al. | |
| 6,136,767 A | 10/2000 | Hineman et al. | |
| 6,143,658 A | 11/2000 | Donnelly, Jr. et al. | |
| 6,204,169 B1 | 3/2001 | Bajaj et al. | |
| 6,232,228 B1 | 5/2001 | Kwag et al. | |
| 6,319,543 B1 | 11/2001 | Soutar et al. | |
| 6,361,712 B1 | 3/2002 | Honda et al. | |
| 6,362,106 B1 | 3/2002 | Kaufman et al. | |

(Continued)

*Primary Examiner*—Roberts Culbert
(74) *Attorney, Agent, or Firm*—Wells St. John P.S.

(57) ABSTRACT

The invention includes methods of cleaning a surface of a cobalt-containing material, methods of forming an opening to a cobalt-containing material, semiconductor processing methods of forming an integrated circuit comprising a copper-containing conductive line, and cobalt-containing film cleaning solutions. In one implementation, a method of cleaning a surface of a cobalt-containing material includes forming a cobalt-containing material over a substrate. The surface of the cobalt-containing material is exposed to an aqueous mixture. The aqueous mixture has an acidic pH and comprises acetic acid, a multiprotic acid, and HF. Other aspects and implementations are contemplated.

31 Claims, 7 Drawing Sheets

U.S. PATENT DOCUMENTS

| | | |
|---|---|---|
| 6,391,794 B1 | 5/2002 | Chen et al. |
| 6,453,914 B2 * | 9/2002 | Torek et al. ................. 134/1.2 |
| 6,486,108 B1 * | 11/2002 | Yates et al. ................. 510/175 |
| 6,541,391 B2 | 4/2003 | Smith et al. |
| 6,589,882 B2 | 7/2003 | Andreas et al. |
| 6,599,370 B2 | 7/2003 | Skee |
| 6,653,243 B2 | 11/2003 | Morgan |
| 6,835,668 B2 | 12/2004 | Andreas et al. |
| 2002/0119656 A1 | 8/2002 | Smith et al. |
| 2005/0104216 A1 * | 5/2005 | Cabral et al. ............... 257/758 |

* cited by examiner

METHOD OF CLEANING A SURFACE OF A COBALT-CONTAINING MATERIAL, METHOD OF FORMING AN OPENING TO A COBALT-CONTAINING MATERIAL, SEMICONDUCTOR PROCESSING METHOD OF FORMING AN INTEGRATED CIRCUIT COMPRISING A COPPER-CONTAINING CONDUCTIVE LINE, AND A COBALT-CONTAINING FILM CLEANING SOLUTION

TECHNICAL FIELD

The invention relates to methods of cleaning a surface of a cobalt-containing material, to methods of forming an opening to a cobalt-containing material, to semiconductor processing methods of forming an integrated circuit comprising a copper-containing conductive line, and to cobalt-containing film cleaning solutions.

BACKGROUND OF THE INVENTION

Copper has a relatively high conductance compared to many other elements, and accordingly can be desired for utilization as a wiring layer in various circuitry applications. For instance in semiconductor processing applications, it can be desired to provide copper wiring layers as electrical paths to various integrated circuit components.

It is often desirable to cover and/or line conductive lines, such as copper-containing conductive lines with conductive diffusion barrier layer materials. Such materials are intended to preclude, or at least reduce, the diffusion of materials into copper-containing lines, as well as to preclude copper from diffusing out of such lines into surrounding material. Some conductive diffusion barrier materials include cobalt. Such materials can be difficult to clean. Further, such cobalt-containing materials will frequently have an outer surface to which electrical connection with other conductive components is ultimately to occur. The formation of such electrical connection will frequently involve providing another conductive material over the surface of the cobalt-containing material, for example through an opening formed in dielectric material(s). The conductive material is intended to physically contact the surface of the cobalt-containing material to form an electrical connection therewith. However, if the surface of the cobalt-containing material is partially or entirely covered with debris (for example an etching residue), the physical connection of the conductive material and the cobalt-containing surface can be impaired. Such can lead to attenuation of the electric current passing between the cobalt-containing material and the conductive material formed thereover.

While the invention was motivated in addressing the above identified issues, it is in no way so limited. The invention is only limited by the accompanying claims as literally worded, without interpretative or other limiting reference to the specification, and in accordance with the doctrine of equivalents.

SUMMARY

The invention includes methods of cleaning a surface of a cobalt-containing material, methods of forming an opening to a cobalt-containing material, semiconductor processing methods of forming an integrated circuit comprising a copper-containing conductive line, and also cobalt-containing film cleaning solutions. In one implementation, a method of cleaning a surface of a cobalt-containing material includes forming a cobalt-containing material over a substrate. The surface of the cobalt-containing material is exposed to an aqueous mixture. The aqueous mixture has an acidic pH and comprises acetic acid, a multiprotic acid, and HF.

In one implementation, a method of forming an opening to a cobalt-containing material includes providing dielectric material over a cobalt-containing material. An opening is etched through the dielectric material to the cobalt-containing material. A surface of the cobalt-containing material forms a base surface of the opening which is at least partially covered by an etch residue. The base surface is cleaned with an aqueous mixture having an acidic pH and comprising acetic acid, a multiprotic acid, and HF to remove at least some of the etch residue from the base surface.

In one implementation, a semiconductor processing method of forming an integrated circuit comprising a copper-containing conductive line includes forming a copper-containing conductive line having a conductive cobalt-containing diffusion barrier layer received thereon over a semiconductor substrate. An oxide-containing dielectric material is provided over the conductive line. An opening is etched through the oxide-containing dielectric material to the cobalt-containing diffusion barrier layer. A surface of the cobalt-containing diffusion barrier layer forms a base surface of the opening, and is at least partially covered by at least one of a non-cobalt oxide, a cobalt oxide, and a cobalt fluoride. The base surface is cleaned with an aqueous mixture having an acidic pH and comprising acetic acid, a multiprotic acid, and HF to remove at least some of the at least one of a silicon oxide and a cobalt oxide from the base surface.

In one implementation, an aspect of the invention contemplates an aqueous mixture independent of method. Such includes a cobalt-containing film cleaning solution comprising an aqueous mixture comprising an acidic pH, acetic acid, a multiprotic acid, and HF.

Other aspects and implementations are contemplated.

BRIEF DESCRIPTION OF THE DRAWINGS

Preferred embodiments of the invention are described below with reference to the following accompanying drawings.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

U.S. Pat. Nos. 6,589,882, 6,835,668, and 6,541,391 are hereby fully incorporated by reference herein. It was discovered when utilizing the etching chemistries of the U.S. Pat. No. 6,589,882 patent on cobalt-containing materials received over copper-containing lines that portions of such cobalt-containing material, on occasion, would be etched completely through upon cleaning to remove etch residue. Accordingly, inventive techniques were developed towards eliminating or minimizing the etch of cobalt-containing materials received over copper-containing metal lines. Although the invention was motivated as just so stated, the invention is in no way so limited, and is limited only by the accompanying claims as individually worded.

One aspect of the invention encompasses a method of cleaning a surface of any cobalt-containing material. Such aspect includes the forming of a cobalt-containing material over a substrate. In one preferred embodiment, such is formed over a semiconductor substrate. In the context of this document, the term "semiconductor substrate" or "semiconductive substrate" is defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above. In one preferred implementation, the cobalt-containing material comprises at least 90% cobalt by weight. In one implementation, a preferred cobalt-containing material comprises cobalt, tungsten, and phosphorus. One exemplary such material includes, by weight, from 1% to 3% tungsten and from 2% to 6% phosphorus, with the remainder being cobalt.

A surface of the cobalt-containing material is exposed to an aqueous mixture having an acidic pH and comprising acetic acid, a multiprotic acid, and HF. Such surface might be at least initially covered with another material which is etched (wet or dry) by another etching chemistry and/or the stated aqueous mixture prior to or commensurate with exposing such surface for etching with such aqueous mixture. In one preferred implementation, the mixture is, by weight, from 1% to 20% acetic acid, from 0.01% to 0.3% HF, and from 0.05% to 0.5% of one or more multiprotic acids. An even more preferred particular example is an aqueous mixture which is, by weight, from 3% to 8% acetic acid, from 0.05% to 0.2% HF, and from 0.1% to 0.3% of one or more multiprotic acids. Regardless, the preferred pH is less than 6, more preferably from 1 to 4, and even more preferably from 1 to 2.

By way of example only, exemplary multiprotic acids include at least one of $H_3PO_4$ and $H_2SO_4$. Additionally by way of example only, other exemplary multiprotic acids comprise polycarboxylic acids, for example dicarboxylic, tricarboxylic, and higher carboxylic acids. Exemplary polycarboxylic acids include citric acid, oxalic acid, malic acid, maleic acid, succinic acid, propanoic acid, butanoic acid, aconitic acid, caperatic acid, and pentanoic acid. An exemplary reduction-to-practice example included, by weight, 5% acetic acid, 0.1% HF, 0.15% citric acid, and with the remaining being de-ionized water.

The aqueous mixture might also comprise multiple multiprotic acids. For example, such a mixture might contain at least one organic or at least two organic multiprotic acids, and/or an aqueous mixture might contain at least one inorganic multiprotic acid.

Exposure of the cobalt-containing material to the aqueous mixture can occur at any suitable temperature, pressure, and period of time. By way of example only, such preferably will include from 10° C. to 40° C., atmospheric pressure, and from 10 seconds to 1 hour. Such exposure to the mixture can comprise, for example, immersion, submersion, spray-rinsing, brush-scrubbing, spin-processing, agitation, recirculation, spray application, the use of megasonics, or a combination of any of these or other techniques whether existing or yet to be developed.

In accordance with overcoming the problem identified above at the beginning of the Preferred Embodiments section, the aqueous mixture is preferably void of $HNO_3$. In the context of this document, "void of $HNO_3$" defines a mixture having no detectable $HNO_3$. However, aspects of the invention do not preclude, and can include, the presence of $HNO_3$ within the aqueous mixture. In such instances, the aqueous mixture preferably comprises no more than 0.05% by weight $HNO_3$, although higher concentrations might be utilized.

Aspects of the invention also contemplate and encompass a cobalt-containing film cleaning solution independent of the practice of methods described and claimed herein. In the context of this document, a "cobalt-containing film cleaning solution" means a solution adapted for cleaning cobalt-containing films, and not a solution necessarily containing cobalt. Such an exemplary preferred solution, independent of method, comprises an aqueous mixture comprising an acidic pH, acetic acid, a multiprotic acid, and HF, for example the above-described aqueous mixtures which might include any of the preferred above attributes.

An exemplary mixture for cleaning the surfaces of cobalt-containing materials can be formed by, for example, combining an acetic acid solution (which can be obtained, for example, as a 99.8% by weight solution), an HF solution (which can be obtained, for example, as a 49% by weight solution of HF in water), a multiprotic acid, and $H_2O$ which is preferably de-ionized.

The cleaning solution can be utilized without adjustment of the resulting pH after mixing water and acid solutions. Alternately, a base can be added to the mixture to adjust the mixture to a desired pH within the acidic range. An exemplary base, for the purpose of pH adjustment, is $NH_4OH$, although other bases can be used alternately or in addition to $NH_4OH$. Although such described process forms a mixture comprising a base cation in combination with the acetate anion, $F^-$, and multiprotic anion by adding a base to an acidic mixture of HF, acetic acid and multiprotic acid, it is to be understood that identical mixtures can be formed by combining various salts in an aqueous solution.

The mixtures formed by the above-described exemplary combination of acid solution where the pH of the solution is not adjusted, will preferably consist essentially of acetate anion, one or more anions of the multiprotic acid, and $F^-$ together with equilibrium components of $H_3O^+$ and $H_2O$, at least at some time prior to the stated exposing. The equilibrium components of $H_3O^+$ and $H_2O$ will be understood by persons of ordinary skill in the art to comprise chemicals in equilibrium with $H_3O^+$ and $H_2O$, for example such as $OH^-$ (i.e., the hydroxide ion). Such description considers the equilibrium components of $H_3O^+$, $OH^-$, and $H_2O$ to be aqueous components of the mixture.

Figure 1:
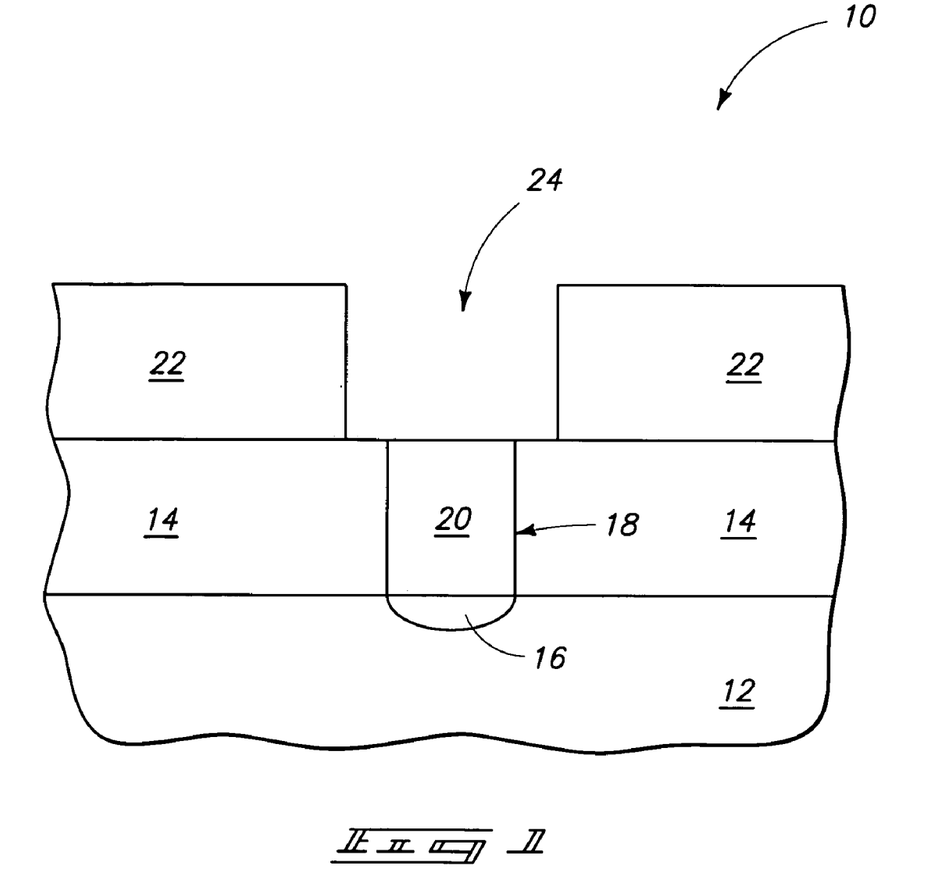
FIG. 1 is a diagrammatic sectional view of a semiconductor substrate fragment in process in accordance with an aspect of the invention.

An aspect of the invention encompasses a method of forming an opening to a cobalt-containing material. Further, an aspect of the invention encompasses a semiconductor processing method of forming an integrated circuit comprising a copper-containing conductive line. By way of example only, exemplary such methods are described with reference to FIGS. 1-7. Referring to FIG. 1, an exemplary semiconductor substrate is indicated generally with reference numeral 10. Such comprises some semiconductive material, for example a bulk monocrystalline silicon substrate 12. However, additional substrates are contemplated, for example semiconductor-on-insulator substrates, and whether existing or yet-to-be developed.

One or more suitable dielectric materials 14 have been formed over substrate 12, with but one exemplary material being a silicon oxide such as borophosphosilicate glass (BPSG). Substrate 12 is depicted as including an exemplary conductive diffusion region 16, for example monocrystalline material 12 doped with a suitable p-type and/or n-type conductivity enhancing impurity. A contact opening 18 is depicted as having been formed in dielectric material 14 to conductive diffusion region 16. Such has been filled with one or more suitable conductive materials 20 (i.e., elemental tungsten). Another dielectric layer or material 22 has been formed over dielectric layer(s) 14 and conductive material 20. Such is depicted as having been patterned to form a suitable trench 24 having a desired cross section and elongated extent in the desired shape and orientation for formation of a conductive line of the integrated circuit being fabricated.

Figure 2:
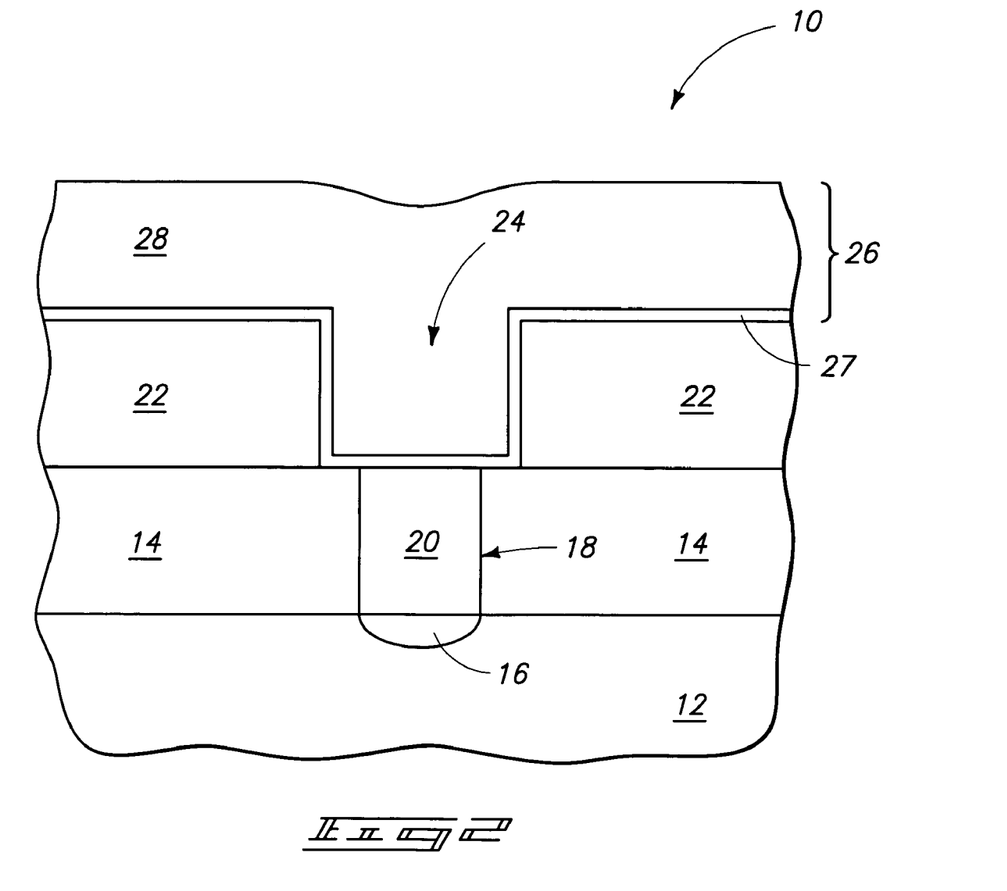
FIG. 2 is a view of the FIG. 1 substrate fragment at a processing subsequent to that shown by FIG. 1.

Referring to FIG. 2, a copper-containing material 26 has been formed within opening 24. By way of example only, such is depicted as comprising a diffusion barrier layer 27 having a copper-containing material 28 formed thereover. Exemplary diffusion barrier materials include one or more of Ta, TaN, Ti, TiN, W, and $WN_x$. In particular embodiments, such material could consist essentially of one or more of Ta, TaN, Ti, TiN, W, and $WN_x$. An exemplary preferred thickness for layer 27 is from 100 Angstroms to 300 Angstroms. An exemplary preferred thickness for material 28 is from 3,000 Angstroms to 10,000 Angstroms. Copper-containing material 28 can comprise, for example, a copper alloy, a copper compound, and/or elemental copper, and can be formed by, for example, sputter deposition, chemical vapor deposition, or electrochemical deposition. In one particular embodiment, copper-containing material 28 might consist essentially of elemental copper (or consist of elemental copper).

Figure 3:
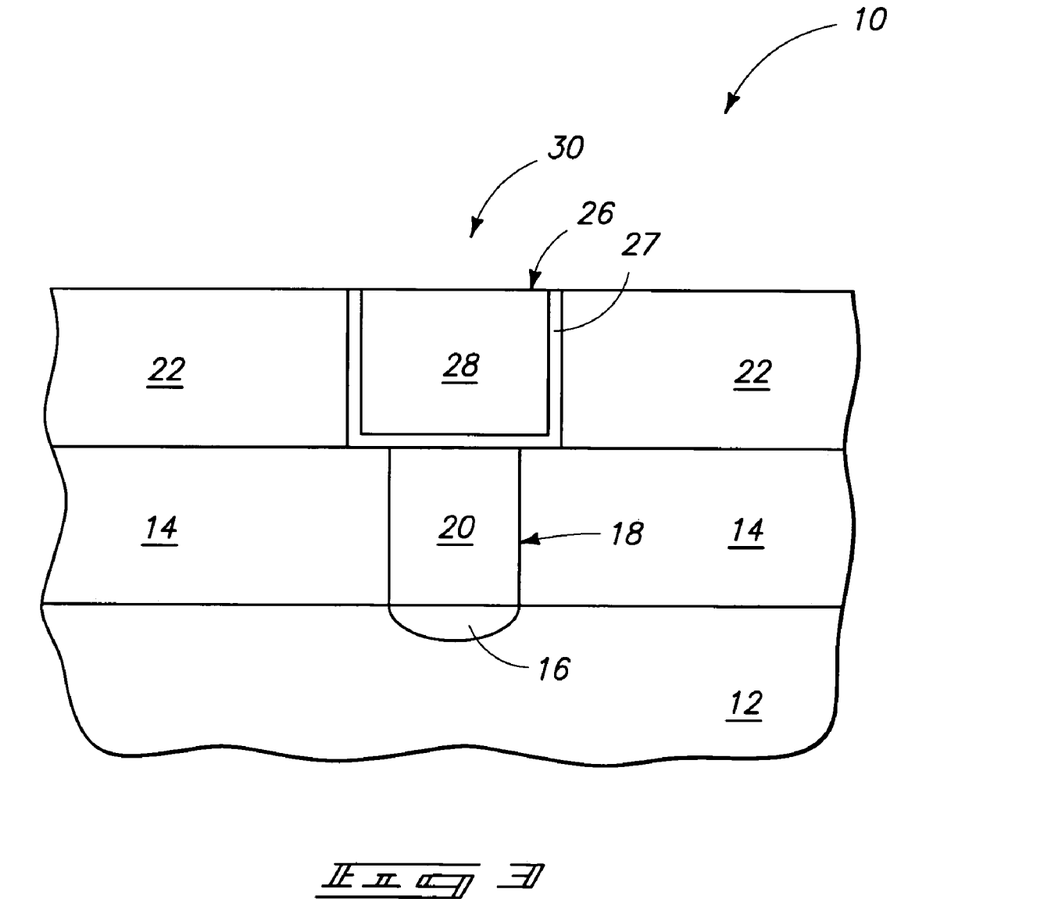
FIG. 3 is a view of the FIG. 2 substrate fragment at a processing subsequent to that shown by FIG. 2.

Referring to FIG. 3, copper-containing material 26 has been planarized back relative to at least an outer surface of material 22. An exemplary preferred technique comprises chemical-mechanical polishing. By way of example only, such thereby forms a copper-containing conductive line 30, for example by a damascene-like process within opening/line-trench 24. However, materials other than conductive and structures other than lines are also contemplated, and of course fabrication by subtractive patterning and etch of copper-containing material 26 (and other techniques) regardless.

Figure 4:
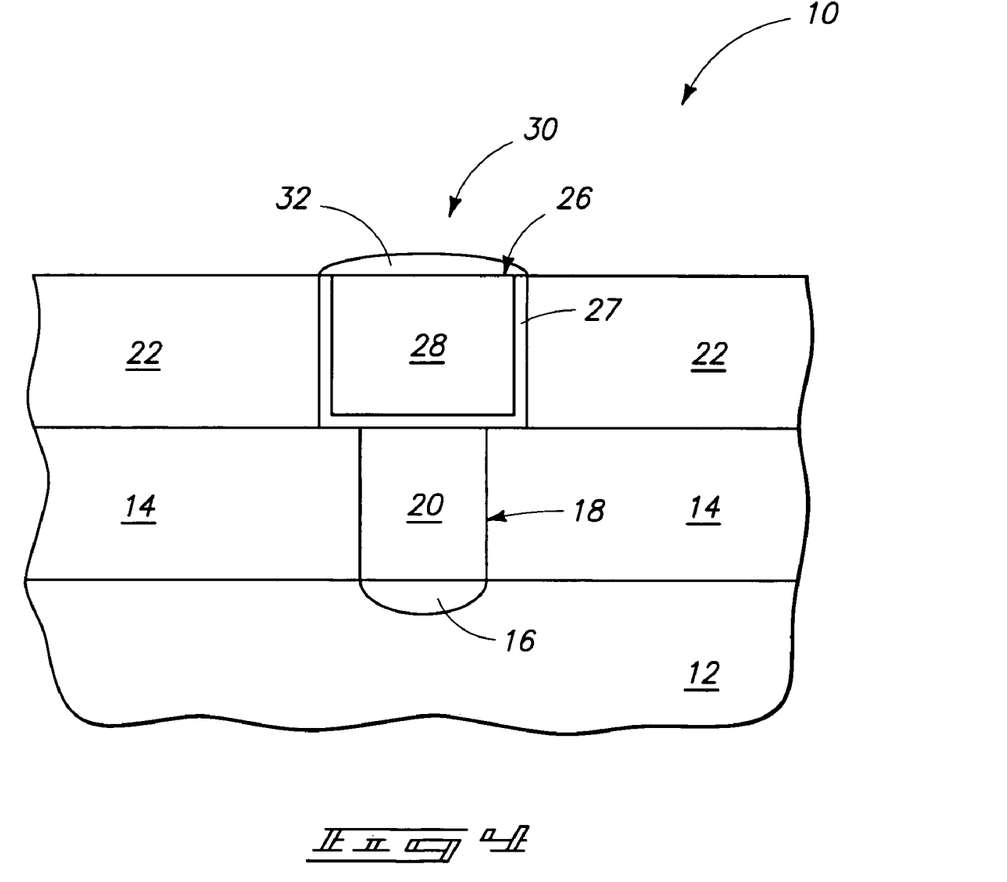
FIG. 4 is a view of the FIG. 3 substrate fragment at a processing subsequent to that shown by FIG. 3.

Referring to FIG. 4, a cobalt-containing material 32 has been formed over or as a part of copper-containing line 30. An exemplary preferred technique for doing so is by electroless chemical deposition, for example over the previously formed copper-containing conductive line 30 of FIG. 3. An exemplary preferred cobalt-containing material comprises cobalt, tungsten and phosphorus having, by weight, from 1% to 3% tungsten from 2% to 6% phosphorus, with the remaining being cobalt. Exemplary such preferred cobalt-containing material preferably functions as a diffusion barrier layer.

Figure 5:
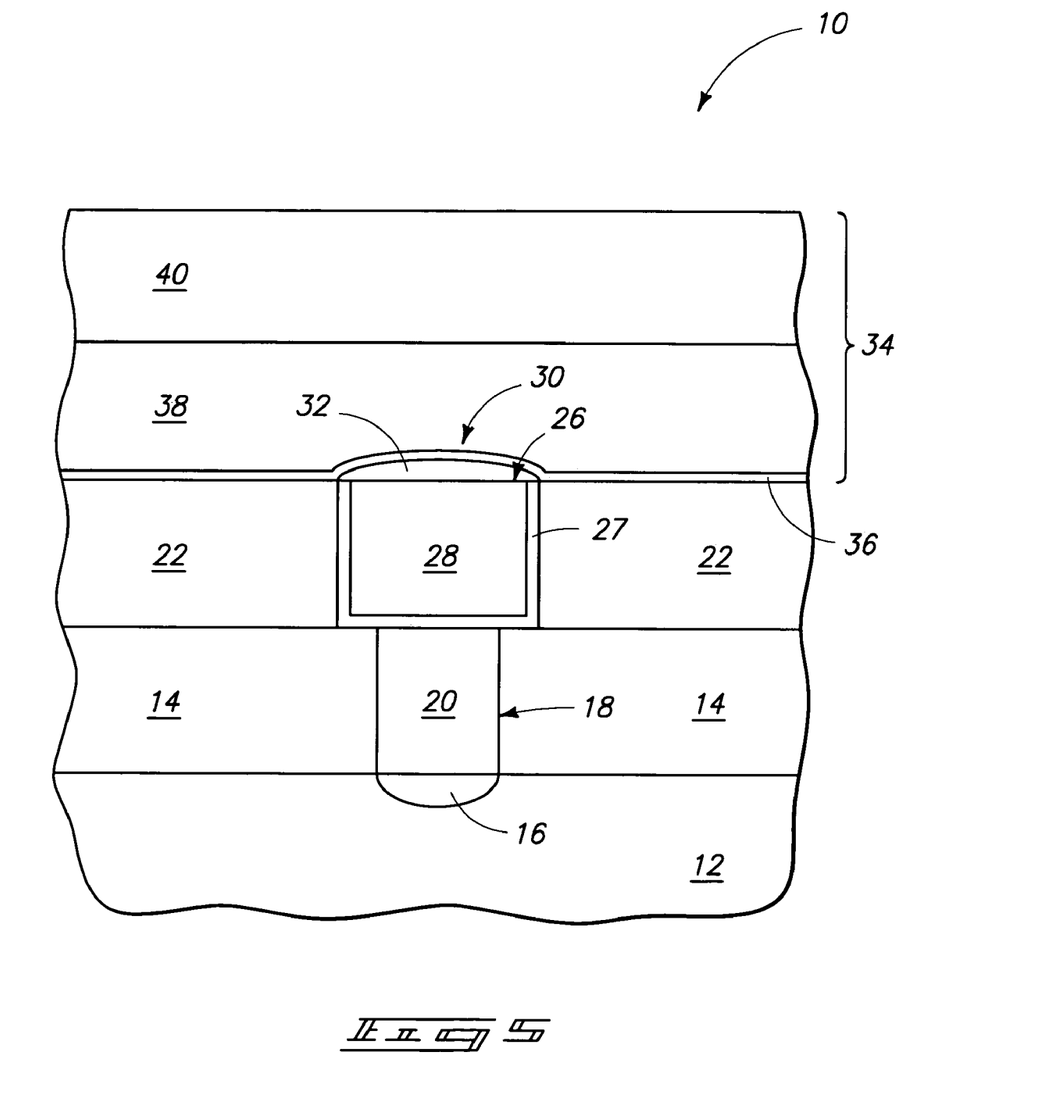
FIG. 5 is a view of the FIG. 4 substrate fragment at a processing subsequent to that shown by FIG. 4.

Referring to FIG. 5, insulative dielectric material 34 has been formed over substrate 12 and over cobalt-containing material 32. In one exemplary embodiment, dielectric material 34 comprises at least one of a silicon oxide, aluminum oxide, silicon carbide, silicon oxynitride, low-κ dielectric materials, and compositions comprising silicon, carbon and nitrogen. In the context of this document, a low-κ dielectric material has a dielectric constant κ no greater than 3.0. By way of example only, depicted dielectric material 34 comprises three layers 36, 38 and 40, by way of example only referred to as barrier material, a first layer and a second layer, respectively. Barrier material 36 can comprise, for example, one or more of a bottom anti-reflective coating material (BARC), a dielectric anti-reflective material (DARC), aluminum nitride, or silicon carbide materials such as BLOK™ (Applied Materials). Barrier layer/material 36 can be formed, for example, by chemical vapor deposition.

Further by way of example only, at least one of first layer 38 and second layer 40 can comprise at least one of an oxide barrier material (for example $Al_2O_3$, $SiO_2$, SiC, silicon oxynitride, or a composition comprising silicon, carbon and hydrogen). Further, one of first layer 38 and second layer 40 might comprise a dielectric material, for example $SiO_2$, SiO, and low-κ dielectric material, for; example SILK™ (Dow Chemical Corporation), BLACK DIAMOND™ (Applied Materials), and CORAL™ (Novellus). Dielectric material 34 is shown as comprising layers 38 and 40 which are formed atop one another. Either layer might comprise the above-described, or other, materials and might consist essentially of the same. An exemplary technique for forming layers 38 and 40 includes chemical vapor deposition. By way of example only, such provides one method of providing dielectric material over a cobalt-containing material.

Figure 6:
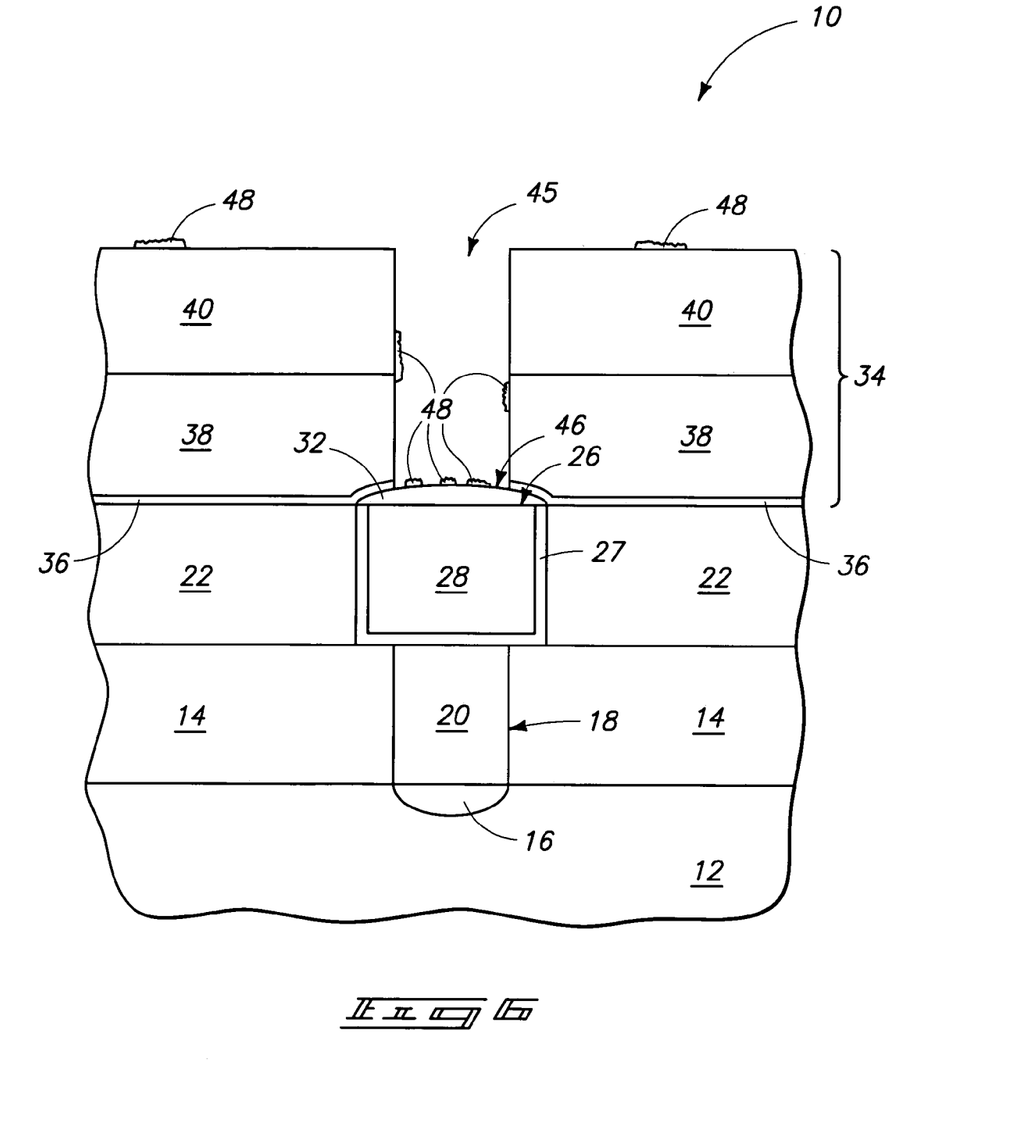
FIG. 6 is a view of the FIG. 5 substrate fragment at a processing subsequent to that shown by FIG. 5.

Referring to FIG. 6, an opening 45 has been etched through dielectric material 34 to cobalt-containing material 32. A preferred technique includes dry anisotropic etching with or without plasma. Opening 45 can be formed by an open barrier etch process that etches through layer 36 to expose cobalt-containing material 32, as shown. In alternate embodiments, a closed etch process might be utilized to initially form opening 45 to not extend completely to cobalt-containing material 32 (not shown). Opening 45 is depicted as defining a base surface 46 of cobalt-containing material 32 within opening 45. Base surface 46 is depicted as being at least partially covered by an etch residue 48, with some of such residue also being depicted over the sidewalls of opening 45 and atop dielectric material 34. By way of example only, exemplary compositions of material 48 include one or more of cobalt oxide, non-cobalt oxide, and cobalt fluoride. Of course, other elements or compounds might also constitute some or all of exemplary residue 48 depending upon the materials of layers 36, 38, 40 and the etching chemistry utilized to form opening 45. (Further, aspects of the invention contemplate no formation of residue and cleaning nevertheless with the exemplary aqueous mixture.)

Figure 7:
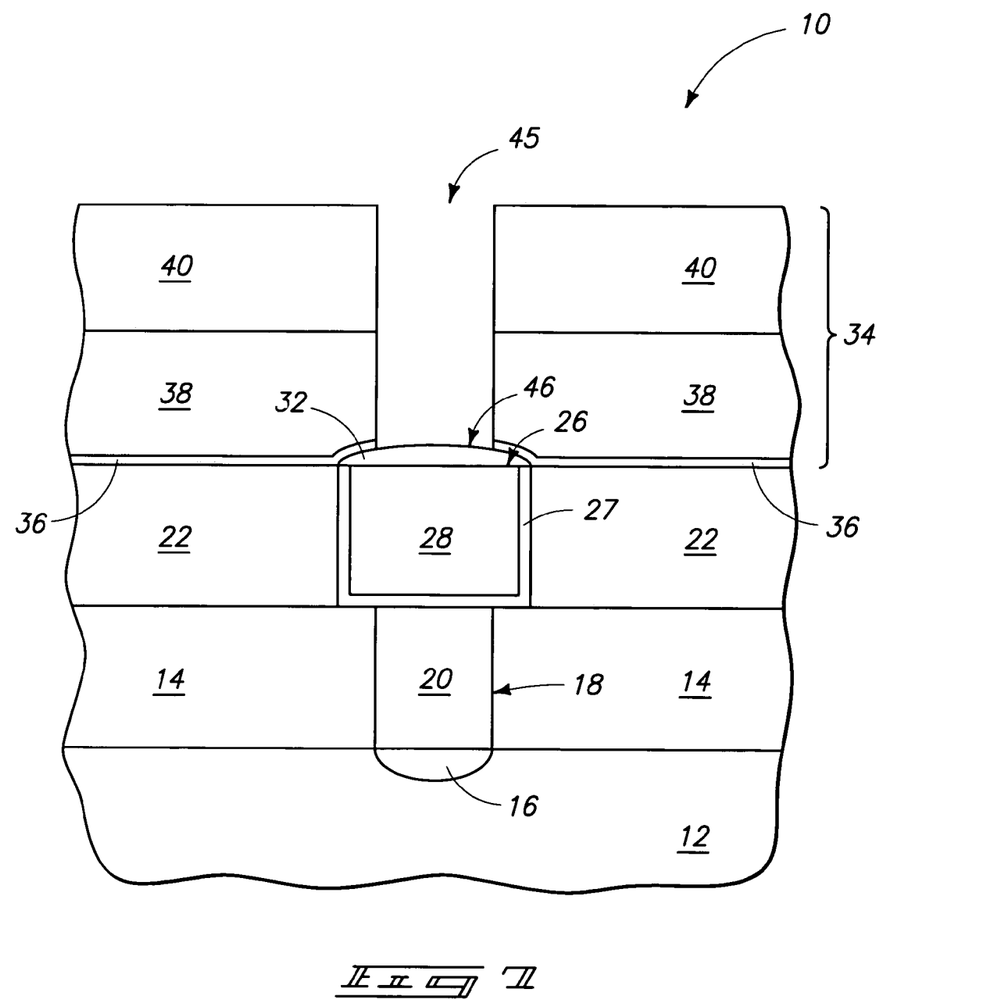
FIG. 7 is a view of the FIG. 6 substrate fragment at a processing subsequent to that shown by FIG. 6.

Referring to FIG. 7, base surface 46 has been cleaned with an aqueous mixture having a preferred pH no greater than 6, and an comprising acetic acid, a multiprotic acid and HF, to remove at least some of the etch residue from base surface 46, and most preferably to remove all of such etch residue 48 (not shown) from base surface 46 and from remaining portions of substrate 10 as well. Exemplary preferred techniques and chemistry include any of those described above.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

The invention claimed is:

1. A method of cleaning a surface of a cobalt-containing material, comprising:
   forming a cobalt-containing material over a substrate; and
   exposing a surface of the cobalt-containing material to an aqueous mixture; the aqueous mixture having an acidic pH and comprising acetic acid, $H_2SO_4$, and HF.

2. The method of claim 1 wherein the cobalt-containing material comprises at least 90% cobalt by weight.

3. The method of claim 1 wherein the cobalt-containing material comprises cobalt, tungsten, and phosphorus.

4. The method of claim 1 wherein the aqueous mixture comprises multiple multiprotic acids.

5. The method of claim 4 wherein at least one of the multiprotic acids is organic.

6. The method of claim 4 wherein at least two of the multiprotic acids are organic.

7. The method of claim 4 wherein at least one of the multiprotic acids is polycarboxylic.

8. The method of claim 1 wherein the mixture is void of $HNO_3$.

9. The method of claim 1 wherein the mixture comprises no more than 0.05% by weight $HNO_3$, if any.

10. The method of claim 1 wherein the mixture comprises $HNO_3$ at no more than 0.05% by weight.

11. The method of claim 1 wherein the mixture comprises a pH of less than 6.

12. The method of claim 1 wherein the mixture comprises a pH of from 1 to 4.

13. The method of claim 1 wherein the mixture comprises a pH of from 1 to 2.

14. The method of claim 1 wherein the mixture is by weight from 1% to 20% acetic acid, from 0.01% to 0.3% HF, and from 0.05% to 0.5% of one or more multiprotic acids including the $H_2SO_4$.

15. The method of claim 14 wherein the mixture is by weight from 3% to 8% acetic acid, from 0.05% to 0.2% HF, and from 0.1% to 0.3% of one or more multiprotic acids including the $H_2SO_4$.

16. The method of claim 1 wherein the mixture consists essentially of acetate anion, one or more anions of one or more multiprotic acids including the $H_2SO_4$, $F^-$, and equilibrium components of $H_3O^+$ and $H_2O$, at least until the exposing.

17. The method of claim 1 wherein the exposing removes one or more of a cobalt oxide, a silicon oxide and a cobalt fluoride from the surface.

18. A method of forming an opening to a cobalt-containing material, comprising:
   providing dielectric material over a cobalt-containing material;
   etching an opening through the dielectric material to the cobalt-containing material, a surface of the cobalt-containing material forming a base surface of the opening, the base surface being at least partially covered by an etch residue comprising one or more of cobalt oxide or cobalt fluoride; and
   cleaning the base surface with an aqueous mixture having an acidic pH and comprising acetic acid, a multiprotic acid, and HF to remove at least some of the etch residue comprising one or more of cobalt oxide or cobalt fluoride from the base surface.

19. A semiconductor processing method of forming an integrated circuit comprising a copper-containing conductive line, comprising:
   forming a copper-containing conductive line having a conductive cobalt-containing diffusion barrier layer received thereon over a semiconductor substrate;
   providing an oxide-containing dielectric material over the conductive line;
   etching an opening through the oxide-containing dielectric material to the cobalt-containing diffusion barrier layer, a surface of the cobalt-containing diffusion barrier layer forming a base surface of the opening, the base surface being at least partially covered by at least one of a non-cobalt oxide, a cobalt oxide, and a cobalt fluoride; and
   cleaning the base surface with an aqueous mixture having an acidic pH and comprising acetic acid, $H_2SO_4$, and HF to remove at least some of the at least one of the non-cobalt oxide, cobalt oxide, and cobalt fluoride from the base surface.

20. The method of claim 19 wherein forming the conductive cobalt-containing diffusion barrier layer comprises electrolessly depositing cobalt-containing material over the copper-containing conductive line.

21. The method of claim 1 wherein the mixture consists essentially of acetate anion, an anion of the $H_2SO_4$, $F^-$, and equilibrium components of $H_3O^+$ and $H_2O$, at least until the exposing.

22. The method of claim 18 wherein the etch residue comprises cobalt oxide.

23. The method of claim 18 wherein the etch residue comprises cobalt fluoride.

24. The method of claim 19 wherein the base surface is at least partially covered by cobalt oxide.

25. The method of claim 19 wherein the base surface is at least partially covered by cobalt fluoride.

26. A method of forming an opening to a cobalt-containing material, comprising:
   providing dielectric material over a cobalt-containing material;
   etching an opening through the dielectric material to the cobalt-containing material, a surface of the cobalt-containing material forming a base surface of the opening, the base surface being at least partially covered by an etch residue; and
   cleaning the base surface with an aqueous mixture having an acidic pH and comprising acetic acid, a multiprotic acid, and HF to remove at least some of the etch residue from the base surface, the aqueous mixture being void of phosphate.

27. The method of claim 1 wherein the aqueous mixture comprises multiple multiprotic acids.

28. The method of claim 27 wherein at least one of the multiprotic acids is organic.

29. The method of claim 27 wherein at least two of the multiprotic acids are organic.

30. The method of claim 27 wherein at least one of the multiprotic acids is polycarboxylic.

31. A method of forming an opening to a cobalt-containing material, comprising:
  providing dielectric material over a cobalt-containing material;
  etching an opening through the dielectric material to the cobalt-containing material, a surface of the cobalt-containing material forming a base surface of the opening, the base surface being at least partially covered by an etch residue; and
  cleaning the base surface with an aqueous mixture having an acidic pH and consisting essentially of, at least until commencing the cleaning, acetic acid, one or more multiprotic acids other than $H_3PO_4$, and HF to remove at least some of the etch residue from the base surface.

* * * * *